United States Patent [19]

Mahulikar et al.

[11] Patent Number: 4,897,508
[45] Date of Patent: Jan. 30, 1990

[54] METAL ELECTRONIC PACKAGE

[75] Inventors: Deepak Mahulikar, Meriden, Conn.; Sheldon H. Butt, Godfrey, Ill.; Jacob Crane, Woodbridge, Conn.; Anthony M. Pasqualoni, New Haven, Conn.; Edward F. Smith, Madison, Conn.

[73] Assignee: Olin Corporation, New Haven, Conn.

[21] Appl. No.: 154,544

[22] Filed: Feb. 10, 1988

[51] Int. Cl.[4] ........................................ H01L 23/20
[52] U.S. Cl. ........................................ 174/52.4; 357/74; 174/17 GF
[58] Field of Search .............. 174/52 FP, 17GF; 357/74

[56] References Cited

U.S. PATENT DOCUMENTS

| | | | |
|---|---|---|---|
| 3,341,369 | 3/1965 | Caule et al. | 148/3 |
| 3,475,227 | 10/1969 | Caule et al. | 148/6.31 |
| 3,728,177 | 4/1973 | Caule | 156/3 |
| 3,871,018 | 3/1975 | Jackson et al. | 174/52 FP |
| 3,943,623 | 3/1976 | Mizutani et al. | 174/52 FP |
| 4,105,861 | 8/1978 | Hascoe | 174/52.4 |
| 4,330,790 | 5/1982 | Burns | 357/70 |
| 4,410,927 | 10/1983 | Butt | 361/386 |
| 4,461,924 | 7/1984 | Butt | 174/52.4 |
| 4,480,262 | 10/1984 | Butt | 357/74 |
| 4,521,469 | 6/1985 | Butt et al. | 428/35 |
| 4,524,238 | 6/1985 | Butt | 174/52.4 |
| 4,525,422 | 6/1985 | Butt et al. | 428/418 |
| 4,532,222 | 7/1985 | Butt | 501/32 |
| 4,542,259 | 9/1985 | Butt | 174/52.4 |
| 4,582,556 | 4/1986 | Butt et al. | 156/325 |
| 4,594,221 | 6/1986 | Caron et al. | 420/485 |
| 4,594,770 | 6/1986 | Butt | 29/588 |
| 4,607,276 | 8/1986 | Butt | 357/79 |
| 4,656,499 | 4/1987 | Butt | 357/74 |
| 4,697,203 | 9/1987 | Sakai et al. | 357/72 |
| 4,704,626 | 11/1987 | Mahulikar et al. | 357/74 |

OTHER PUBLICATIONS

Electrical Manufacturing, May 1957, p. 142.
"Future Packages Heat Transfer Will Affect PCB Designs" by Ernel R. Winkler appeared in 4/85 Edition of *Packaging & Production*, pp. 104–109.

Primary Examiner—Picard Leo P.
Assistant Examiner—David A. Tone
Attorney, Agent, or Firm—Gregory S. Rosenblatt; Paul Weinstein

[57] ABSTRACT

A metal package for housing an electronic device wherein the electronic device is attached to a severable die attach pad. The die attach pad is bonded to the base of the package with a thermally conductive medium. The base is bonded to the die attach pad and to the leadframe at the same time to reduce the thermal degradation of the sealants. In other embodiments, apertures are provided in the base component to enhance cooling of the electronic device and in the cover component to vent reaction by-products.

36 Claims, 1 Drawing Sheet

METAL ELECTRONIC PACKAGE

The present invention relates to a process for making a package to house an electronic device and the package so produced. The package is characterized by improved resistance to thermal degradation and improved dissipation of heat from the enclosed electronic device.

Several basic package designs are used by the electronics industry to house integrated circuits. The integrated circuits, usually fashioned from a semiconductor material and typically from silicon, must be protected from the outside environment and must electrically connect to external components. Balanced against these requirements is a need to minimize cost of manufacture and assembly of the package.

The electronics industry has generally followed one of two lines; maximum protection of the electronic device for example with the ceramic dual-in-line package or minimum cost, for example by the encapsulated plastic package. There are distinct disadvantages to both concepts.

The ceramic dual-in-line package (CERDIP) is comprised of two pieces of alumina or other ceramic glass bonded to a leadframe with a suitable solder glass forming a hermetic enclosure. A problem associated with a CERDIP is poor thermal dissipation. To maximize thermal dissipation capabilities of a CERDIP, beryllium oxide is sometimes substituted for aluminum oxide. While the thermal capabilities of the package is improved, the cost increases significantly. The CERDIP is generally used for high value electronic requirements, for example, state-of-the-art computers or military applications.

Plastic packages usually comprise an electronic device mounted on a lead frame encapsulated with a plastic resin, generally an epoxy. The plastic package is less expensive to manufacture than the CERDIP and more adaptable to automated procedures. The plastic package is generally not hermetic and not suitable for high value electronic requirements. Additionally, the plastic package has poor thermal dissipation.

Throughout this application, the term "hermetic" is used in accordance with Military Specification 883B and defined as a package cavity leak rate of less than $5 \times 10^{-8}$ cm$^3$/sec when measured using a helium tracer gas.

A package which seeks to overcome the disadvantages of the CERDIP and the plastic package is the metal package. The metal package is comprised of a leadframe disposed between a metal or metal alloy cover and base component. The leadframe is bonded to the base and cover using an electrically insulating adhesive, typically a solder glass or polymer adhesive. Generally, a solder glass is used if a hermetic package is desired. Examples of a metal package using a solder glass may be found in U.S. Pat. Nos. 4,524,238, 4,532,222, 4,542,259, 4,607,276 and 4,656,499 all issued to Butt.

A problem associated with the metal package is a mismatch in the coefficient of thermal expansion between the metal component and the conventional CERDIP solder glasses. The metal components are typically copper or a copper based alloy and have coefficients of thermal expansion (CTE) of about $160-170 \times 10^{-7}$ in/in/°C. while the low temperature solder glasses were originally designed to match the CTE of aluminum oxide CERDIP packages and have a CTE of about $49 \times 10^{-7}$ in/in/°C. If the CTE mismatch exceeds 10% the glass may fracture due to stresses introduced during thermal cycling resulting in a loss of hermeticity.

Methods to get a close match in coefficients of thermal expansion include the use of a graded seal as disclosed in U.S. Pat. No. 4,704,626 to Mahulikar et al. and the use of appropriately chosen filler material such as calcium fluoride to change the coefficient of thermal expansion of the glass as disclosed in U.S. Pat. Nos. 4,801,488 and 4,752,521 both entitled Sealing Glass Composite by Smith III and Smith III et al., respectively.

Hermetic metal packages have the added advantage of excellent dissipation of heat generated by the electronic device during operation. As metal packages contain a cavity, the surface of the electronic device is not subjected to stresses during thermal cycling as occurs with a molded plastic package.

Metal packages have also been used to replace components in plastic packages. As with glass sealed packages, a metal leadframe is disposed between a metal or metal alloy base and cover component. The package is sealed with a polymer adhesive, typically an epoxy. Examples of a metal package with a polymer adhesive sealant are in U.S. Pat. Nos. 4,461,924, 4,480,262 and 4,594,770 all to Butt and U.S. Pat. No. 4,105,861 to Hascoe.

Polymer adhesives are generally more compliant than sealing glasses. There is no need to match the coefficient of thermal expansion of the package components to the adhesive. Thermally induced stresses will be absorbed and damped by the polymer adhesive. A difficulty with the metal package utilizing a polymer adhesive is it is not hermetic in accordance with Mil. Spec. 883B.

Additionally, the polymers are not thermally stable and tend to degrade during post-cure heating cycles. One method of evaluating the package sealant is commonly called the pressure cooker test. The test comprises immersion of a sealed package in a pressure cooker at 121° C., a relative humidity of 100% and a pressure of 30 psi. It has been found that metal packages sealed with polymer adhesives delaminate within a relatively short amount of time during this test. This test is an accelerated environmental test and indicates how well the package will protect the electronic device from air and moisture.

In accordance with the present invention, a leadframe containing a centrally positioned die attach pad is provided. An electronic device, typically a silicon semiconductor chip, is bonded to the die attach pad. The die attach pad is bonded to the package base and the base and cover components are sealed to the leadframe. The package goes through at least one fewer sealing cycle than prior art packages resulting in substantial improvements in the functional life of the sealant.

In another embodiment of the present invention, an aperture is provided in the base component. The die attach pad is sealed over the aperture. The embodiment permits improved removal of heat from the electronic device.

Accordingly, it is an object of the present invention to provide a metal package sealed with a polymer which is more resistant to thermal degradation.

It is a further object of the present invention to provide a metal package with a polymer sealant requiring fewer assembly steps than present metal packages.

It is yet another object of the present invention to provide a metal package with improved thermal dissipation characteristics.

These and further objects and advantages will become more apparent from the following description and drawings in which like reference numerals depict like elements.

Figure 1:
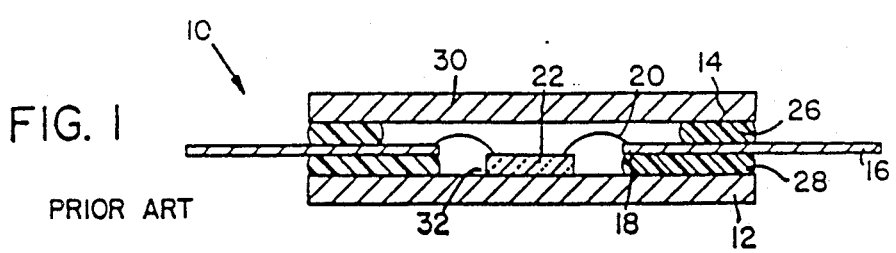
FIG. 1 is a cross-sectional representation of a metal package as known from the prior art.

FIG. 1 is a cross-sectional representation of a prior art housing 10 for encapsulating an electronic device 22. The typical method of manufacture is to fasten the leadframe 16 to the base component 12 using a first sealant 28. The first sealant is generally a low melting solder glass or a polymer adhesive. A typical solder glass for use in sealing electronic packages is a lead borate glass matrix usually containing one or more other glass components. One example of a solder glass is the mixture 75%-85% PbO, 0.5%-16% ZnO and 8%-15% $B_2O_3$. Any solder glass with an appropriate coefficient of thermal expansion may be utilized. A typical polymer sealant is a heat curable epoxy such as novalac.

A typical sealing profile for a solder glass is about 410°-430° C. for 10 minutes and for an epoxy a typical curing cycle is about 150° to 170° C. for about 30 to 120 minutes.

After the first sealant is cured and the leadframe affixed in place, the electronic device 22, often a silicon based semiconductor chip, is attached. The electronic device is attached either directly to the base component 12 by a die attach 32 or to a buffer (not shown) which is then fastened to the base component. A buffer system is disclosed in U.S. patent application Ser. No. 826,808, filed Feb. 10, 1986, by Pryor et al.

The coefficient of thermal expansion of the base component or buffer determines the choice of die attach material 32 used. If the CTE of the base component or buffer is within about 10% the CTE of the electronic device, typically $49 \times 10^{-7}$ in/in/°C., a hard solder such as 98% Au/2% Si may be used. If the CTE of the base component or buffer does not approach that of the electronic device, a more forgiving die attach is used. For example, a soft solder such as 95% Pb/ 5% Sn or an electrically conductive polymer adhesive such as a silver filled epoxy may be used.

A thermal treatment is required to activate the die attach. If Au/Si solder is used this thermal treatment generally is about 420° C. for about 5 seconds. For Pb/Sn solder, a temperature of about 200° C. for about 20 seconds is used and for the filled polymer about 150° C. for about 30 minutes. Regardless of the die attach chosen, the first sealant 28 is subjected to a second heating and cooling cycle.

The lead wires 20 are next bonded to the electronic device 22 and inner lead portions 18 to electrically connect the electronic device to the outside world through leadframe 16. The lead wires are typically gold or aluminum wires or thin strips of copper foil if the process known as tape automated bonding (TAB) is used. Bonding may be by ultrasonic welding, thermal bonding or thermal compression bonding. Some heat of bonding may be transmitted through the leads subjecting the first sealant 28 to another thermal cycle. A typical bonding temperature is about 240° C. for about 5 seconds.

Next, a second sealant 26 is applied to the cover component 14. The second sealant is usually chosen to have the same composition as the first sealant 28 to insure chemical compatibility although this is not necessary as disclosed in previously cited U.S. Pat. No. 4,704,626. The cover component 14 is then positioned adjacent to the leadframe 16 and bonded to the side of the leadframe opposite the base component. A sealing profile suitable to cure the second sealant 26 is required. The first sealant 28 is once more subjected to a thermal cycle.

The prior art package is now complete. If first and second sealants 28,26 were solder glass the package is hermetic, if an epoxy the package is probably not hermetic. It has been found multiple thermal cycling of the first sealant 28 impacts detrimentally on the integrity of the package. One embodiment of the present invention is to provide for the manufacture of a housing for an electronic device which does not subject the first sealant to the multiple thermal cycles of the prior art.

Figure 2:
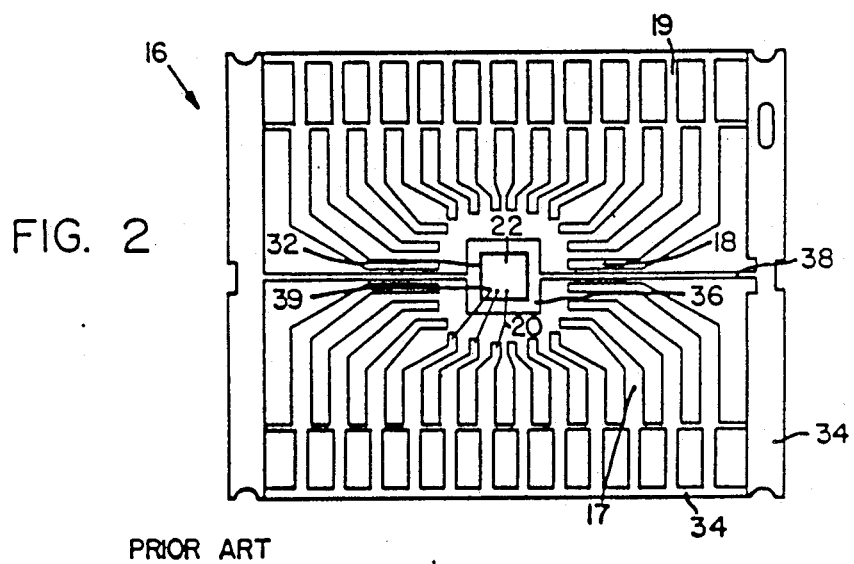
FIG. 2 is a schematic representation of a known leadframe with an electronic device affixed thereto which is used in the present invention.
Figure 3:
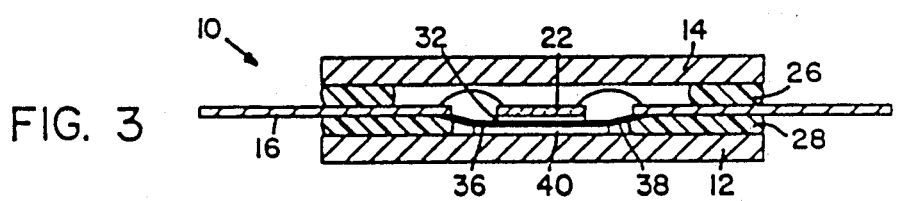
FIG. 3 is a cross-sectional representation of a metal package in accordance with one embodiment of the present invention.

FIGS. 2 and 3 illustrate the assembly of a housing 10 for an electronic device 22 in accordance with the present invention.

Referring to FIG. 2, a schematic of a leadframe 16 as known in the art is shown. The leadframe 16 is comprised of an electrically conductive material. Leadframes are typically fashioned from Alloy 42 (an iron-nickel alloy containing 58% Fe and 42% Ni), KOVAR (an iron-nickel-cobalt alloy containing 54% Fe, 29% Ni and 17% Co), copper or a copper based alloy. The leadframe may be plated or clad with a second material to enhance bonding to the sealant, improve corrosion resistance or improve appearance. Typically the leadframe for a metal package is a copper based alloy such as C638 described in U.S. Pat. Nos. 3,341,369 and 3,475,227 to Caule et al. or C724 as described in U.S. Pat. No. 4,594,221 to Caron et al. Alloys C638, C724, C7025 and similar copper based alloys form a refractory oxide layer which facilitates bonding of the alloy to a solder glass. Alternatively, dilute copper alloys, essentially pure copper with trace amounts of additives, are also used as leadframes due to the high electrical conductivity they impart as compared to other copper alloys and added strength they have compared to pure copper. A typical dilute copper alloys for use in leadframes is C194 (2.35% Fe, 0.03% P, 0.12% Zn and the balance Cu). The leadframe is comprised of lead fingers 17 which are made up of inner lead portions 18 for bonding to the electronic device 22 and outer lead portions 19 for electrically connecting the electronic device to an external device, for example, by insertion into a printed circuit board. The leadframe also contains tie bars 34 to support the lead fingers 17 during assembly operations. The tie bars 34 are generally severed once the leadframe is in place to electrically isolate the leads from each other. Some leadframes also contain a centrally positioned die attach pad 36 which is connected to the tie bars by die attach pad supports 38. Leadframes with die attach pads are usually used in plastic encapsulated packages to provide a site to mount the chip and provide electrical contact to the back side of the chip.

The use of a die attach pad in a plastic encapsulated package is disclosed in U.S. Pat. No. 4,697,203 issued to Sakai el al. The use of a die attach pad with a metal package is disclosed in U.S. Pat. No. 4,656,499.

In accordance with the present invention, the electronic device 22 which is typically a semiconductor chip made of silicon although other semiconductor materials such as germanium or gallium arsenide may also be used is attached to the die attach pad 36 by a die attach material 32. Dependent upon the composition of the leadframe 16 and the corresponding coefficient of thermal expansion of the leadframe, the die attach may be a eutectic solder such as gold based Au/Si or lead based such as 95% Pb/5% Sn, or a soft solder such as lead based 60% Pb/40% Sn or 92.5% Pb/5% Sn/2.5% Ag or a polymer adhesive such as a heat curable epoxy. The list of die attach materials is given for the purpose of example and is not meant to be all encompassing, any suitable die attach material could be used within the scope of the present invention. If an epoxy die attach is used, it may be conducting or insulating dependent upon whether backside electrical contact is desired. The epoxy may be made electrically conductive by filling it with a conductive metal (for example, silver) powder.

The electronic device 22 is next connected to the inner lead portions 18 through bonding wires 20. These wires are frequently made of thin, about 0.001" diameter strands of gold or aluminum. In the alternative, thin strips of copper foil are used for TAB bonding as disclosed in U.S. Pat. No. 4,330,790 issued to Burns. The wires 20 are bonded by conventional wire bonding techniques to bonding sites 39 on the electrically active face of the electronic device 22. The opposite ends of the wires are bonded to the inner portions 18 of the leadframe 16 thereby creating an electric connection between the electronic device 22 and the outer lead portions 19.

The leadframe 16 containing the die attached and wire bonded electronic device 22 is now ready for further assembly in accordance with the present invention. Reference is made to FIG. 3 which shows an assembled package in accordance with the present invention.

In a first process embodiment, a base component 12 containing first sealant 28 and third sealant 40 is provided. The first sealant 28 is selected from the group consisting of nonconductive solder glasses, ceramics, thermosetting polymers and thermoplastic polymers. The third sealant 40 is selected from the group consisting of solder glasses, ceramics, metal alloy solders, thermosetting polymers and thermoplastic polymers. Dependent on whether the back side of the chip is to be electrically connected to the package base or electrically isolated, the third sealant 40 is either a dielectric or an electrical conductor. The third sealant is usually made electrically conductive by filling it with a conductive metal powder. Carbon filling may be utilized. The third sealant 40 is also characterized by high thermal conductivity. Preferred third sealants 40 for the present invention are silver filled epoxy or soft solder such as Pb/Sn. The leadframe 16 is positioned adjacent to the sealant containing face of the base component. Frequently, the thickness of the first sealant 28 is greater than the thickness of the third sealant 40 and the difference is compensated for by downsetting the die attach pad support 38'. Downsetting also helps maintain electrical isolation between the inner lead portions and the die attach pad supports. In the alternative, after curing the first and third sealants, the die attach pad supports 38 may be severed.

The leadframe is bonded to the base component by an appropriate curing cycle for the first and third sealants. An advantage of the present embodiment over an embodiment described hereinbelow is the package is open during the thermal cure so by-products of the cure, for example, chloride ions from an epoxy may escape into the atmosphere.

A cover component 14 containing a nonconductive second sealant 26 selected from the same group as the first sealant 28 and frequently, although not necessarily identical to the first sealant is positioned adjacent to the unbonded side of the leadframe. The cover component is sealed to the leadframe by an appropriate thermal cycle thereby forming a housing for the electronic device.

An improvement of the present invention over the prior art is the first sealant is subjected to only one additional thermal cycle, thereby reducing the thermal degradation.

A second embodiment of the present invention seals the first 28 and second 26 sealants at the same time. A leadframe 16 with the electronic device 22 already die attached and wire bonded is disposed between a base component 12 and a cover component 14. First sealant 28 is disposed between the first side of the leadframe and the base component. Third sealant 40 is disposed between the die attach pad and the base component. Second sealant 26 is disposed between the cover component and the second side of the leadframe. An appropriate thermal cycle is chosen to cure all three sealants simultaneously.

The advantage of the second embodiment of the invention over the prior art is the first sealant 28 is subjected to only a cure cycle and not to excess thermal cycles. The structure of an electronic package made according to the present invention resembles the metal package sealed with solder glass disclosed in U.S. Pat. No. 4,656,499 to Butt entitled Hermetically Sealed Semiconductor Casing. However the Butt method of assembly is completely different and does not encompass the improvements necessary to reduce thermal degradation of the sealants.

Figure 4:
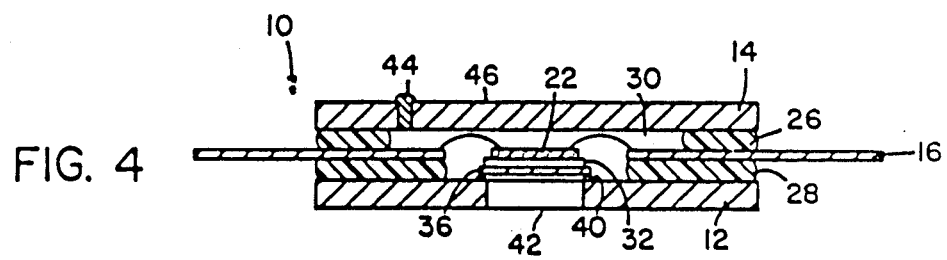
FIG. 4 is a cross-sectional representation of a metal package in accordance with a second embodiment of the present invention.

Another embodiment of the present invention is shown in FIG. 4. A housing for an electronic device 10 is assembled using either of the above disclosed embodiments. An aperture 42 is provided in the base component 12'. The aperture allows the escape of reaction by-products generated during the sealing cycle. The first sealant 28, second sealant 26 and third sealant 40 may all be cured at the same time and the accumulation of residue within the enclosure 30 of the housing is less than with previous embodiments. The third sealant 40 is a ring type seal surrounding the aperture 42. The seal 40 bonds the die attach pad to the base 12'.

A second improvement realized by the aperture 42 within the base component 12' is the proximity of the chip to outside influences. As the electronic device 22 is operated, electricity passes through the device. Some of the electricity is converted into heat due to the internal resistance of the semiconductor circuitry. This heat reduces the operating life of the semiconductor chip and is preferably removed. Common means of removing the generated heat are metal heatsinks located below the chip and forced air or forced fluid cooling. An overview of these heatsink means may be found in the article entitled "Future Packages' Heat Transfer Will Affect PCB Designs" by Ernel R. Winkler which appeared in the April 1985 edition of

ELECTRONIC PACKAGING & PRODUCTION.

The aperture 42 permits a forced air or forced fluid cooling means to be positioned in close proximity to the electronic device 22. The use of a cooling material with high heat capacity, for example helium gas, results in improved cooling. This improved cooling becomes more important as the density of electronic circuits on the semiconductor device increases resulting in greater heat generation during operation of the chip.

Rather than a fluid, a solid material with high heat capacity, for example copper or silver may be inserted into the aperture 42 and used as a conduit (heat sink) to transfer heat from the electronic device.

Yet another embodiment of the present invention is the inclusion of a second aperture 44 within the cover component 14'. The aperture 44 is a vent for reaction by-products generated during the cure cycle. After the cure cycle is completed, an inert thermally conductive gas such as helium or a thermally conductive, electrically non-conductive liquid or powder may optionally be injected into the package cavity 30 to provide additional thermal dissipation means for the electronic device 22. The aperture is then sealed by applying a suitable patch, for example a drop of solder 48 to the outer surface 46 of the cover component. Alternatively, the aperture 44 could be sealed by any preferred means such as plastic. The apertures 42 and 44 can be employed alone or in combination as desired.

While the present invention has been described in terms of a metal package, the techniques described are suitable for ceramic packages, such as CERDIP, or plastic packages.

The patents and publications set forth in the specification are intended to be incorporated by reference herein.

It is apparent there has been provided in accordance with this invention means of assembling electronic packages and the products of those assembly means which fully satisfy the objects, means and advantages set forth hereinbelow. While the invention has been described in combination with specific embodiments thereof, it is evident that many alternatives, modifications and variations will be apparent to those skilled in the art in light of the forgoing description. Accordingly, it is intended to embrace all such alternatives, modifications and variations as fall within the spirit and broad scope of the appended claims.

We claim:

1. A process for assembling a package containing an enclosure to house an electronic device, comprising the steps of:
   providing an electrically conductive leadframe, said leadframe having first and second surfaces and comprised of a plurality of lead fingers disposed about a centrally positioned die attach pad, said electronic device bonded to said die attach pad and electrically connected to said leads;
   providing a first, second and third bonding means;
   providing a base component;
   providing a cover component;
   bonding said base component to said first surface of said leadframe with said first bonding means and at essentially the same time bonding said base component to said die attach pad with said third bonding means; and
   bonding said cover component to said second surface of said leadframe with said second bonding means.

2. The process of claim 1 including severing said die attach pad from said leadframe prior to the step of bonding said cover component to said leadframe.

3. The process of claim 2 providing said third bonding means is thermally conductive.

4. The process of claim 3 further providing said third bonding means is a silver filled epoxy.

5. The process of claim 1 providing said first and second sealing means are either sealing glass is or polymer adhesives.

6. The process of claim 5 wherein said first and second sealing means are essentially identical.

7. The process of claim 6 including said first and second sealing means are heat curable epoxies.

8. The process of claim 7 providing said cover component is bonded to said second surface of said leadframe by said second bonding means at essentially the same time as said base component is bonded to said first surface of said leadframe and to said die attach pad.

9. The process of claim 8 including the additional step of providing a first aperture in said base component prior to bonding said die attach pad, said first aperture sized smaller than said die attach pad so said die attach pad seals said first aperture.

10. The process of claim 9 providing said third sealing means is ring shaped and positioned about the edge of said first aperture and disposed between said base component and said die attach pad.

11. The process of claim 1 including providing a second aperture in said cover component and sealing said second aperture subsequent to sealing said cover component to said second surface of said leadframe.

12. The process of claim 11 including introducing a thermally conductive medium to said enclosure through said second aperture prior to sealing said second aperture.

13. The process of claim 12 including selecting said thermally conductive medium to be an electrically non-conductive gas, liquid or powder.

14. The process of claim 11 including sealing said second aperture with an epoxy or solder plug.

15. The process of claim 14 including sealing said second aperture with a solder plug, said solder comprised essentially of an alloy of lead and tin.

16. A package containing an enclosure for housing an electronic device, comprising:
   a base component containing a first aperture;
   a cover component;
   a leadframe with first and second opposing sides disposed between said base component and said cover component, said leadframe containing a plurality of leads disposed about a centrally positioned die attach pad, said die attach pad positioned to seal said first aperture and adapted to support said electronic device, said electronic device electrically connected to said leads;
   a first bonding means to seal said base component to said first side of said leadframe;
   a second bonding means to seal said cover component to said second side of said leadframe; and
   a third bonding means to seal said die attach pad to said base component.

17. The package of claim 16 wherein said third bonding means encircles the edge of said first aperture and is disposed between said base component and said die attach pad.

18. The package of claim 17 wherein said third bonding means is thermally conductive and selected from the group consisting of solder glasses, thermosetting polymer adhesives and thermoplastic polymer adhesives.

19. The package of claim 18 wherein said third bonding means is a silver filled epoxy.

20. The package of claim 19 wherein said first and second bonding means are electrically nonconductive and selected from the group consisting of solder glasses, thermosetting polymer adhesives and thermoplastic polymer adhesives.

21. The package of claim 20 wherein said first and second bonding means are essentially identical.

22. The package of claim 21 wherein said first and second bonding means are heat curable epoxies.

23. A package containing an enclosure for housing an electronic device, comprising:
- a base component;
- a cover component containing an aperture sealed with a plug;
- a leadframe with first and second opposing sides disposed between said base component and said cover component, said leadframe containing a plurality of leads disposed about a centrally positioned die attach pad and adapted to support said electronic device, said electronic device electrically connected to said leads;
- a first bonding means to seal said base component to said first side of said leadframe;
- a second bonding means to seal said cover component to said second side of said leadframe; and
- a thermally conductive third bonding means to seal said die attach to said base component, said third bonding means selected from the group consisting of solder glasses, thermosetting polymer adhesives and thermoplastic polymer adhesives.

24. The package of claim 23 wherein said first and second means are electrically nonconductive and selected from the group consisting of solder glasses, thermosetting polymer adhesives and thermoplastic polymer adhesives.

25. The package of claim 24 wherein said first and second bonding means are essentially identical.

26. The package of claim 25 wherein said enclosure is filled with a thermally conductive medium.

27. The package of claim 26 wherein said thermally conductive medium is electrically nonconductive and selected from the group consisting of gases, liquids and powders.

28. The package of claim 27 wherein said thermally conductive medium is helium.

29. A package containing an enclosure to house an electronic device, comprising:
- a base component containing a first aperture;
- a cover component containing a second aperture, said second aperture sealed with a plug;
- a leadframe with first and second opposing sides disposed between said base component and said cover component, said leadframe containing a plurality of leads disposed about a centrally positioned die attach pad, said die attach pad positioned to seal said first aperture and adapted to support said electronic device, said electronic device electrically connected to said leads;
- a first bonding means to seal said base component to said first side of said leadframe;
- a second bonding means to seal said cover component to said second side of said leadframe; and
- a third bonding means positioned about the edge of said first aperture and disposed between said base component and said die attach component.

30. The package of claim 29 wherein said third bonding means is thermally conductive and selected from the group consisting of solder glasses, thermosetting polymer adhesives and thermoplastic polymer adhesives.

31. The package of claim 30 wherein said first and second bonding means are electrically nonconductive and selected from the group consisting of solder glasses, thermosetting polymer adhesives and thermoplastic polymer adhesives.

32. The package of claim 31 wherein said first and second bonding means are essentially identical.

33. The package of claim 29 wherein said plug sealing said second aperture is a solder or polymer adhesive.

34. The package of claim 33 wherein said plug is a solder comprised of lead and tin.

35. The package of claim 29 wherein said enclosure is filled with a thermally conductive, electrically insulating medium.

36. The package of claim 35 wherein said enclosure is filled with helium.

* * * * *

UNITED STATES PATENT AND TRADEMARK OFFICE
CERTIFICATE OF CORRECTION

PATENT NO. : 4,897,508

DATED : January 30, 1990

INVENTOR(S) : Mahulikar et al

It is certified that error appears in the above—identified patent and that said Letters Patent is hereby corrected as shown below:

At column 9, line 34, between "attach" and "to", please insert ---pad---.

Signed and Sealed this

Fourth Day of August, 1992

Attest:

DOUGLAS B. COMER

*Attesting Officer*  *Acting Commissioner of Patents and Trademarks*